United States Patent [19]

Tanimoto

[11] Patent Number: 4,728,519
[45] Date of Patent: Mar. 1, 1988

[54] POLYCHROMATIC ELECTROLUMINESCENT PANEL
[75] Inventor: Satoshi Tanimoto, Yokosuka, Japan
[73] Assignee: Nissan Motor Co., Ltd., Yokohama, Japan
[21] Appl. No.: 672,208
[22] Filed: Nov. 16, 1984
[30] Foreign Application Priority Data Dec. 9, 1983 [JP] Japan .................. 58-231343

[51] Int. Cl.⁴ .............................. B05D 5/06
[52] U.S. Cl. ...................... 427/66; 427/43.1; 427/68; 427/259; 427/282; 427/287; 430/23
[58] Field of Search ............... 427/43.1, 68, 264, 282, 427/66, 287, 166, 165, 259, 64; 430/23; 313/506, 509, 503

[56] References Cited
U.S. PATENT DOCUMENTS

| | | | |
|---|---|---|---|
| 2,924,732 | 2/1960 | Lehmann | 313/506 |
| 3,919,589 | 11/1975 | Hanak | 313/506 |
| 4,015,166 | 3/1977 | Ohshima et al. | 313/503 |
| 4,117,177 | 9/1978 | Schlater | 427/68 |
| 4,155,627 | 5/1979 | Gale et al. | 427/43.1 |
| 4,234,669 | 11/1980 | Pearlman | 427/68 |
| 4,326,007 | 4/1982 | Williams et al. | 427/66 |
| 4,414,059 | 11/1983 | Blum et al. | 427/43.1 |
| 4,481,233 | 11/1984 | Sakata et al. | 427/68 |
| 4,485,158 | 11/1984 | Harper | 427/64 |

FOREIGN PATENT DOCUMENTS

| | | | |
|---|---|---|---|
| 0054366 | 5/1977 | Japan | 427/68 |
| 54-155789 | 12/1979 | Japan | |
| 1559850 | 1/1980 | United Kingdom | |

OTHER PUBLICATIONS
SID International Symposium Digest of Technical Papers, Tues. May 11/Wed. May 12/Thurs. May 13/, San Diego, CA, vol., XIII.

Primary Examiner—Janyce A. Bell
Attorney, Agent, or Firm—Schwartz, Jeffery, Schwaab, Mack, Blumenthal & Evans

[57] ABSTRACT

In order to provide a structure which is not susceptible to the so called "peel-off" phenomenon which tends to occur with arrangements wherein electroluminescent layers are arranged one over the top of each other in discrete overlapping layers, and to avoid the use of yeild reducing etchants which readily attack the electroluminescent material through the inevitable pin holes and cracks which appear in the insulating layers covering the elements during the production of the panel, the light emitting elements are formed in side by side or non-overlapping relationships via a lift off technique. This obviates both the peel-off phenomenon and use of corrosive etchants.

7 Claims, 12 Drawing Figures

POLYCHROMATIC ELECTROLUMINESCENT PANEL

BACKGROUND OF THE INVENTION

1. Field of the Invention

The present invention relates generally to display panels and more specifically to an electroluminescent panel and a method of producing same, which exhibits a high yield and which enables the production of panels which are free from peel-off phenomenon and the like.

2. Description of the Prior Art

Japanese Patent Application first provisional publication No. Sho 54-155789 discloses a polychromatic electroluminescent element which is produced by forming on a transparent substrate, a plurality of layers (one directly on top of the other) which each produce different colours when excited.

However, this arrangement suffers from the drawback that it is possible only to generate a "mixed" colour (Viz., a colour which results from mixing the colours produced by each of the individual layers) as the layers cannot be individually excited.

Another previously proposed method of forming an electroluminescent panel, disclosed on pages 128 and 129 of the Syposium Digest 1982 of SID (Society of Information Display), allows individually excitement. This technique includes forming on a glass substrate 1, via vacuum evaporation deposition, sequential layers (having a thickness of 5000 Å to 10,000 Å in thickness) comprising (in order) a transparent electrode 2, a transparent insulating film 3 (e.g. $Y_2O_3$), a layer 4 of ZnS:Mn (i.e. zinc sulphide doped with an impurity level of manganese), a second transparent layer 5 (e.g. $Y_2O_3$), a second transparent electrode 6 having shape and orientation selected with respect to that of the first electrode 2, another transparent insulating film 7 followed by a layer 8 of $ZnS:TbF_3$ (zinc sulphide doped with impurity levels of $TbF_3$), and a final transparent insulating film 9 (for example $Y_2O_3$).

Aluminium electrodes 10 and 11 are attached to the film electrode 6 and the insulating film 9, as shown.

With the above described construction, when an AC power of 1 KHz 200 Vrms is applied across electrodes 2 and 6 by a power source 12, the layer of ZnS:Mn becomes excited and emits orange light as indicated by arrow "O" while when a similar current is applied across electrodes 6 and 11 by power source 13, the layer of $ZnS:TbF_3$ becomes excited and emits green light which is transmitted through the various layers as shown by arrow "G".

Although it would appear from FIG. 1 that the two beams of light "O" and "G" originate in different zones, they are in fact so close together as to effectively appear in a common zone.

Further, with the just described arrangement, it is possible to produce only two colours. Accordingly, to produce more colours it is necessary to add further layers including for example, $ZnS:PrF_3$ which generates white light when excited, $ZnS:DyF_3$ which generates yellow light, or $ZnS:TmF_3$ which produces blue light.

However, where the number of colours to be produced is N, the number of layers which must be formed one on top of the other is $4N+1$. Viz., for each colour five layers must be formed. This of course is a considerable number of layers and renders the arrangement susceptible to the so called "peel-off" phenomenon.

Experiments have shown that the sites where peel-off is most likely to occur is between the ZnS layers and the insulating film formed over same and between the intermediate electrodes and the insulating film on the electrode.

Moreover, with the above type of arrangement the transparent intermediate electrodes are provided by using photolithic techniques which require acidic etchants. For example, when iTo (a mixture of indium oxide and tin oxide) layers are used, the etchant takes the form of a 1:1:0.1 solution of $H_2O$, HCl and $HNO_3$. Accordingly, during production, the ZnS layers which have little resistance to acidic solutions are often attached by etchant which leaks through the inevitable pin holes and cracks which occur from place to place in the insulating films.

It should be noted that although the intermediate electrodes can be formed using an evaporative masking technique, it is not possible to acheive the desired level of accuracy (i.e. pattern definition) when this technique is used.

The incidence of the above mentioned problems increase exponentially with N and thus renders the production of such units which produce more than 2 or 3 colours commercially impractical.

SUMMARY OF THE INVENTION

It it an object of the present invention to provide a method for producing electroluminescent panels which permits a panel capable of emitting a large number of different colours to be commercially produced without the arrangement being susceptible to peel-off phenomenon and which simultaneously enables a high yeild.

In brief, the above object is fulfilled via a method wherein in order to provide a structure which is not susceptible to the so called "peel-off" phenomenon, which tends to occur with arrangements wherein electroluminescent layers are arranged one over the top of each other in discrete overlapping layers, and to avoid the use of yeild reducing etchants which readily attack the electroluminescent material through the inevitable pin holes and cracks which appear in the insulating layers covering the elements during the production of the panel, the light emitting elements are formed in side by side or non-overlapping relationships via a lift-off technique. This obviates both the peel-off phenomenon and use of corrosive etchants.

More specifically, in its broadest sense the present invention takes the form of a method of producing a polychromatic luminous panel having a plurality of electrodes and a transparent substrate, which features the steps of: forming a first light emitting element on the transparent substrate using a lift off technique; and forming a second light emitting element on the transparent substrate in a non-overlapping relationship with the first light emitting element using a lift off technique.

A further aspect of the invention comes in an electroluminescent panel construction which features a transparent substrate; a first transparent electrode formed on the substrate; a first light emitting element formed of a first electroluminescent material, the first light emitting element having a shadow which falls on the first electrode; a second light emitting element formed of a second electroluminescent material, the second light emitting element having a shadow which falls on the first electrode in close proximity to and in a non-overlapping relationship with the that of the first light emitting element; a second electrode which overlays the first light emitting element; and a third electrode which overlays the second light emitting element.

BRIEF DESCRIPTION OF THE DRAWINGS

The features and advantages of the arrangement of the present invention will become more clearly appreciated from the following description taken in conjunction with the accompanying drawings in which.

DETAILED DESCRIPTION OF THE PREFERRED EMBDODIMENTS

Figure 1:
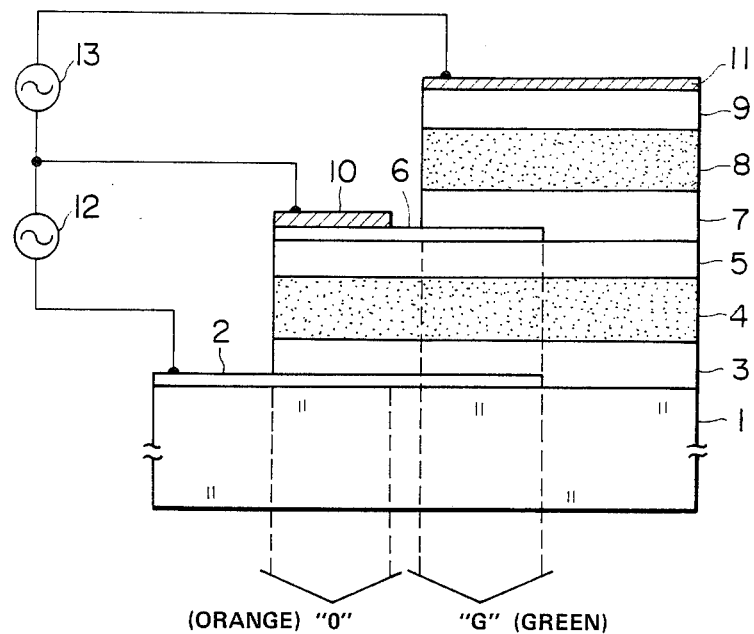
FIG. 1 is a sectional view of one of the prior art electroluminescent panel structures discussed in the opening paragraphs of the present disclosure.
Figure 2:
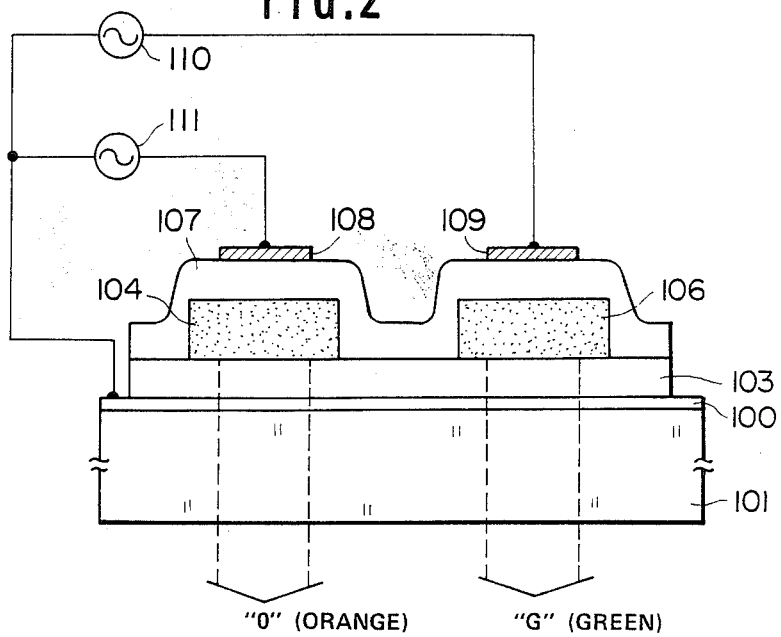
FIG. 2 is a sectional elevation (taken along section line II—II of FIG. 10) showing a first embodiment of the present invention.

FIG. 2 shows a first embodiment of the present invention. In this arrangement transparent electrodes 100 (iTo) are formed on a scrupulously clean substrate 101 which in this embodiment takes the form of a glass panel. Formed on top of the electrodes 100 is a insulating layer or film 103 (e.g. $Y_2O_3$). Disposed atop of the insulating layer are first and second electroluminescent elements 104, 106, the shadows of which fall on the electrodes 100 in a side-by-side non-overlapping relationship. A insulating film 107 (e.g. $Y_2O_3$) is formed over the electroluminescent elements 104, 106 and metallic (e.g. aluminium) electrodes 108, 109 are formed on top of the insulating layer 107 in a manner to overlay the electroluminescent elements. 1 KHz 200 Vrms power sources 110, 111 are connected to the electrodes 100, 108 and 109 as shown.

With this arragement the light emissions (viz., orange and green) produced by the electroluminescent elements are separated as shown by the arrows labelled "O" and "G", respectively.

FIGS. 3 to 10 illustrate the method via which the above described structure is formed.

Figure 3:
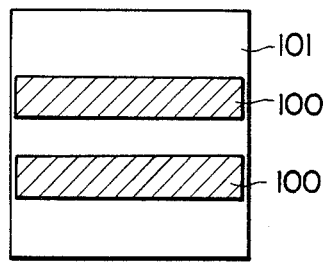
FIGS. 3 to 10 show various stages of the production of the first embodiment according to the method which characterizes the present invention.
Figure 6:
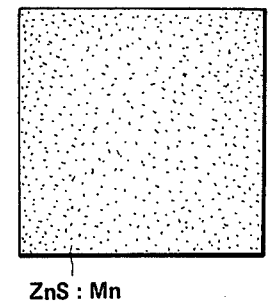

Firstly, the glass substrate 101 is cleaned and and a layer of iTo or $In_2O_3$ formed over the surface via an evaporation depositing technique. Subsequently, as shown in FIG. 3, the transparent layer is partially removed via photo-lithography to define two electrodes 100 (see FIG. 3). It will be noted that for simplicity of explantion alone, only two electrodes are formed and it is to be understood than any number having any particular configuration or configurations may be formed in this step.

Figure 4:
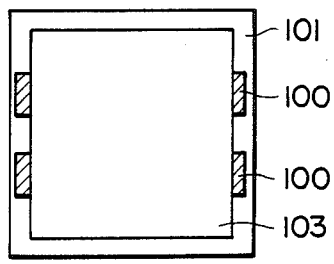

Following this, the insulating layer or film 103 having a thickness of approximately 5000 Å is deposited by way of a resistive heating vapour depositing or sputtering deposition technique over the surface of the substrate 101 in manner to cover the electrodes 101 (see FIG. 4).

In order to form the electroluminescent elements 104, a temporary layer 112 of resist is formed over the entire surface of the structure or article thus far formed. This temporary layer 112 may take the form of OFPR-800 manufactured by Tokyo Ohka Pty. Ltd. This material does not require any acidic developing or releasing solutions and can withstand temperatures in excess of 150° C.

Figure 5:
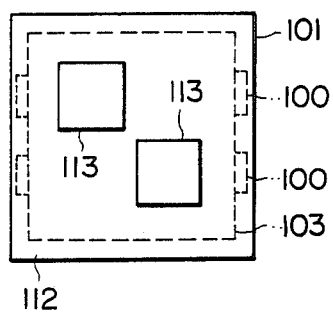
Figure 8:
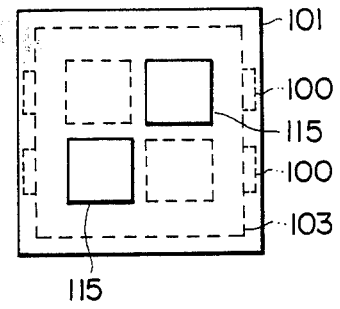

Subsequently, suitable apertures 113 are cut out of the temporary layer 112 using a electron beam technique (see FIG. 5). During this step, the substrate 101 is heated to approximately 150° C.

Following the formation of the desired number of apertures 113 at the appropriate sites, the apertures 113 are filled with orange light emitting ZnS:Mn (by way of example) via an evaporation deposition technique (substrate heated to approx. 150° C.). During this step a layer of ZnS:Mn having a thickness of 8000 Å is formed over the entire surface of the article (see FIG. 6).

Subsequently, the article is placed in releasing solution and both the temporary layer 112 and the layer of ZnS:Mn covering same, are removed. This removal will be referred to as "lift-off" hereinafter.

Figure 7:
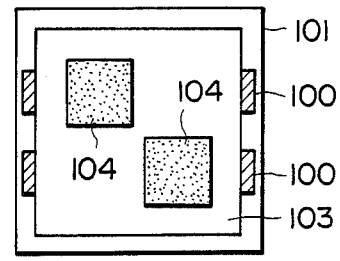

FIG. 7 shows the electroluminescent elements 104 (ZnS:Mn) which remain after the lift-off technique has been performed.

In order to form the next series of electroluminescent elements 106 (for example those which produce green light) a second temporary layer of resist is applied over the surface of the article and the appropriate apertures 115 are cut. Next, the apertures are filled via the formation of a layer of $Zn:TbF_3$ over the surface of the article in a manner similar to that shown in FIG. 6. By placing the article in release solution the second series of electroluminescent elements 106 may be obtained via lift-off.

As will be appreciate the above described steps may be repeated to form electroluminescent elements which generate other colours. However, for the sake of explanation the production of di-chromatic device will be given for brevity.

Figure 9:
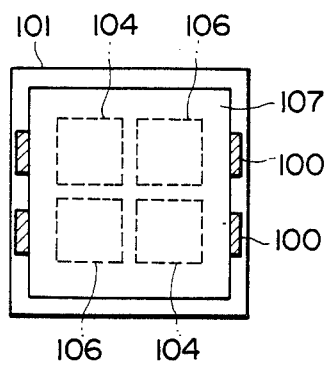

After the formation of the second series of electroluminescent elements, the article is treated at 500° C. for approximately 1 hour under vacuum and thereafter the insulating layer 107 of $Y_2O_3$ having a thickness of approximately 5000 Å is formed via evaporation deposition (see FIG. 9).

Figure 10:
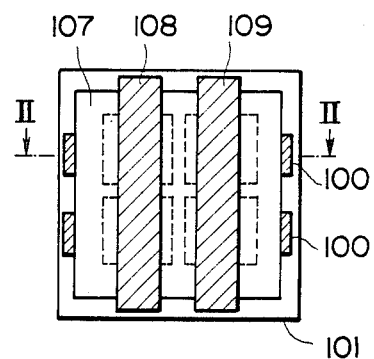

Finally, the metallic electrodes 108, 109 are formed by firstly depositing a layer of aluminium via vacuum evaporation deposition followed by a suitable photolithic technique to remove the excess metal and derive the desired shape (see FIG. 10).

Figure 11:
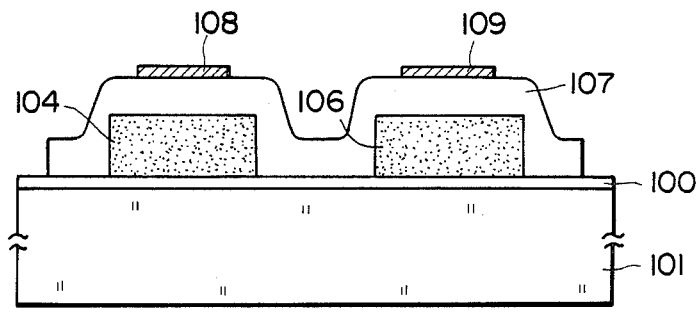
FIGS. 11 and 12, show in sectional elevation second and third embodiment of the present invention, respectively.
Figure 12:
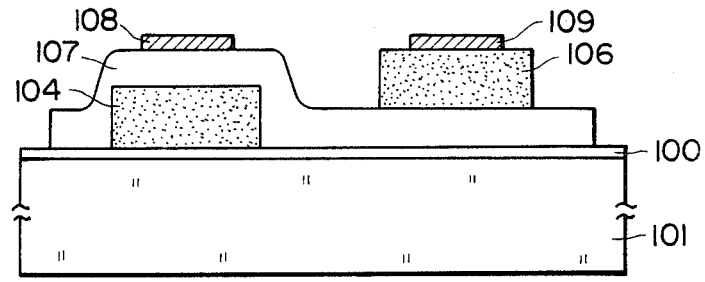

FIGS. 11 and 12 show second and third embodiments of the present invention. The arrangement shown in FIG. 11, differs form that that shown in FIG. 2 by the omission of the insulating layer 103. It should be noted that the present invention is not limited to electroluminescent panels wherein at least one side of the electroluminescent elements are covered with an insulating layer and encompass those which include no such layers at all.

The arrangement shown in FIG. 12 can be produced by applying the insulating layer 107 of $Y_2O_3$ before the second temporary layer 112. The metallic electrodes 180, 109 may be formed on the insulating layer 107 and directly on the $ZnS:TbF_3$ electroluminescent element 106 using the previously mentioned photolithic technique.

In situations where fine accuracy is not required the lift-off technique may be replaced by an evaporative masking technique.

As will be appreciated with the present invention as the need for intermediate electrodes as found in the prior art is eliminated along with the need for immersion of the article in acidic etchants, errosion of the ZnS electroluminescent elements is obviated. Further, via the use of the lift-off technique it is possible to form a polychromatic luminous panel having detail finer than 1 mm. Further merits of the invention come in the ability to readily produce a panel which can produce 3 or more colours without fear of encountering peel-off.

What is claimed is:

1. In a method of producing a polychromatic luminous panel having a plurality of electrodes and a transparent substrate, the first steps of:
    forming a first light emitting element that emits light of a first color on said transparent substrate using a lift off technique; and
    forming a second light emitting element that emits light of a second color on said transparent substrate in a non-overlapping relationship with said first light emitting element using a lift off technique.

2. In a method of forming an electroluminescent panel the steps of:
    forming a first transparent electrode on a transparent substrate;
    forming a first temporary layer over said substrate;
    forming a first shaped aperture in said temporary layer so that the shadow of said first aperture falls on said first electrode;
    filling said first aperture with a first electroluminescent material that emits light of a first color;
    removing said first temporary layer using a lift off technique so that a first clearly defined light emitting element having the shape of said first aperture remains;
    forming a second temporary layer which covers at least said first light emitting element and an area surrounding same;
    forming a second shaped aperture in said second temporary layer in a manner that the shadow thereof falls on said first electrode in close proximity to and in a non-overlapping relationship with the shadow of said first light emitting element;
    filling said second aperture with a second electroluminescent material that emits light of a second color;
    removing said second temporary layer using a lift off technique in a manner to leave a second clearly defined light emitting element having the shape of said second aperture in close proximity to and in a side-by-side non-overlapping relationship with said first light emitting element; and
    forming second and third electrodes so that said second electrode overlays said first light emitting element and said third electrode overlays said second light emitting element.

3. A method as claimed in claim 2, futher comprising the step of:
    forming a transparent insulating layer on said substrate which partially covers said first electrode before said step of forming said first temporary layer.

4. A method as claimed in claim 2, further comprising the step of:
    forming a transparent insulating layer over said first and second light emitting elements before forming said second and third electrodes.

5. In a method of forming an electroluminescent panel the steps of:
    forming a first transparent electrode on a transparent substrate;
    forming a first temporary layer over said substrate;
    forming a first shaped aperture in said temporary layer so that the shadow of said first aperture falls on said first electrode;
    filling said first aperture with a first electroluminescent material that emits light of a first color;
    removing said temporary layer using a lift off technique so that a first clearly defined light emitting element having the shape of said first aperture remains;
    forming an insulating layer which covers said first light emitting element and which partially covers said first electrode;
    forming a second temporary layer which extends at least over said first light emitting element and an area surrounding same;
    forming a second shaped aperture in said second temporary layer which has a shadow which falls on said first electrode in close proximity to and in a non-overlapping relationship with the shadow of said first light emitting element;
    filling said second aperture with a second electroluminescent material that emits light of a second color;
    removing said second temporary layer using a lift off technique in a manner to leave a second clearly defined light emitting element on said insulating layer which has the shape of said second aperture and which has a shadow which falls in close proximity to and in a non-overlapping relationship with the shadow of said first light emitting element;
    forming a second electrode on said insulating layer so as to overlay said first light emitting element; and
    forming a third electrode on said second light emitting element.

6. In a method of forming an electroluminescent panel the steps of:
    forming a first transparent electrode on a transparent substrate;
    selecting a resist material having a thermal resistance in excess of 150° C.;
    forming a first temporary layer of said resist over said substrate and said transparent electrode;
    heating said substrate to approximately 150° C.;
    forming a first shaped aperture in said temporary layer so that the shadow of said first aperture falls on said first electrode;
    maintaining said substrate at approximately 150° C.;
    filling said first aperture with a first electroluminescent material that emits light of a first color;
    removing said temporary layer using a solution which dissolves the resist material;
    forming a second temporary layer of said resist which covers at least said first light emitting element and an area surrounding the same;
    heating said substrate to approximately 150° C.;
    forming a second shaped aperture in said second temporary layer in a manner that the shadow thereof falls on said first electrode in close proximity to and in a non-overlapping relationship with the shadow of said first light emitting element;
    maintaining said substrate at approximately 150° C.;
    filling said second aperture with a second electroluminescent material that emits light of a second color;

removing said second temporary layer using a solution which dissolves the resist material;
forming a transparent insulating layer over said first and second light emitting elements; and
forming second and third electrodes so that said second electrode overlays said first light emitting element and said second third element overlays said second light emitting element.

7. In a method of forming an electroluminescent panel the steps of:
forming a first transparent electrode on a transparent substrate;
selecting a resist material having a thermal resistance in excess of 150° C.;
forming a first temporary layer of said resist over said substrate and said transparent electrode;
heating said substrate to 150° C.;
forming a first shaped aperture in said temporary layer so that the shadow of said first aperture falls on said first electrode;
maintaining said substrate at 150° C.;
filling said first aperture with a first electroluminescent material that emits light of a first color;
removing said first temporary layer using a solution which dissolves the resist material;
forming an insulative layer which covers said first light emitting element and which partially covers said first electrode;
forming a second temporary layer of said resist which covers at least said first light emitting element and an area surrounding the same;
heating said substrate to 150° C.;
forming a second shaped aperture in said second temporary layer in a manner that the shadow thereof falls on said first electrode in close proximity to and in a non-overlapping relationship with the shadow of said first light emitting element;
maintaining said substrate at 150° C.;
filling said second aperture with a second electroluminescent material that emits light of a second color;
removing said second temporary layer using a solution which dissolves the resist material;
forming a second electrode on said insulating layer so as to overlay said first light emitting element; and
forming a third electrode on said second light emitting element.

* * * * *